United States Patent [19]
Hisamune

[11] Patent Number: 5,891,775
[45] Date of Patent: Apr. 6, 1999

[54] METHOD OF MAKING NONVOLATILE SEMICONDUCTOR DEVICE HAVING SIDEWALL SPLIT GATE FOR COMPENSATING FOR OVER-ERASING OPERATION

[75] Inventor: Yosiaki Hisamune, Tokyo, Japan

[73] Assignee: NEC Corporation, Tokyo, Japan

[21] Appl. No.: 881,494

[22] Filed: Jun. 24, 1997

Related U.S. Application Data

[62] Division of Ser. No. 536,847, Sep. 29, 1995, abandoned.

[30] Foreign Application Priority Data

Sep. 29, 1994 [JP] Japan .................................. 6-259093

[51] Int. Cl.⁶ ................................................ H01L 21/8247
[52] U.S. Cl. ............................................ 438/267; 438/596
[58] Field of Search ................................. 257/315–320; 365/185.33, 185.16, 185.12; 438/266, 267, 588, 593, 594, 595, 596

[56] References Cited

U.S. PATENT DOCUMENTS

| | | | |
|---|---|---|---|
| 4,925,807 | 5/1990 | Yoshikawa | 438/596 |
| 5,041,886 | 8/1991 | Lee | 257/320 |
| 5,268,585 | 12/1993 | Yamauchi | 438/267 |
| 5,364,806 | 11/1994 | Ma et al. | 438/266 |
| 5,455,792 | 10/1995 | Yi | 257/319 |
| 5,607,871 | 3/1997 | Han | 438/267 |

FOREIGN PATENT DOCUMENTS 2-23672  1/1990  Japan .

OTHER PUBLICATIONS

K. Naruke et al., "A New Flash–Erase EEPROM Cell With A Sidewall Select–Gate On Its Source Side", *Tech. Digest of IEDM*, 1989, pp. 603–606 No Month.

*Primary Examiner*—Chandra Chaudhari
*Attorney, Agent, or Firm*—Sughrue, Mion, Zinn, Macpeak & Seas, PLLC

[57] ABSTRACT

In a nonvolatile semiconductor memory device, including a semiconductor substrate, a floating gate formed over the semiconductor substrate, and a control gate formed over the floating gate, a split gate is formed on a sidewall of the control gate and the floating gate and is electrically connected to the control gate. A source region and a drain region are formed in the semiconductor substrate on the sides of the control gate and the split gate.

12 Claims, 20 Drawing Sheets

METHOD OF MAKING NONVOLATILE SEMICONDUCTOR DEVICE HAVING SIDEWALL SPLIT GATE FOR COMPENSATING FOR OVER-ERASING OPERATION

This is a Divisional of application Ser. No. 08/536,847, now abandoned filed Sep. 29, 1995.

BACKGROUND OF THE INVENTION

1. Field of the Invention

The present invention relates to a nonvolatile semiconductor memory device such as an electrically erasable and programmable read only memory (EEPROM), and more particularly, to a nonvolatile semiconductor device including memory cells each having a split gate for compensating for an over-erasing operation.

2. Description of the Related Art

Generally, an EEPROM cell includes a P-type semiconductor substrate having an $N^+$-type source region and an $N^+$-type drain region, a floating gate via an insulating layer on the semiconductor substrate between the source region and the drain region, and a control gate via another insulating layer on the floating gate. In a write mode, a high positive voltage is applied to the drain region and another high positive voltage is applied to the control gate, while the source region is grounded. As a result, hot electrons having an energy larger than an energy barrier of the insulating layer between the floating gate and the semiconductor substrate are introduced into the floating gate, thus completing a writing operation. In this case, the threshold voltage of the EEPROM cell is made higher. On the other hand, in an erase mode, the source region is in a floating state, a positive voltage is applied to the drain region, the substrate is grounded, and a negative voltage (or the ground potential) is applied to the control gate. As a result, the electrons stored in the floating gate are extracted therefrom to the drain region utilizing the Fowler-Nordheim tunneling effect. To realize the Fowler-Nordheim tunneling effect, the insulating layers are made very thin.

In the above-mentioned erase mode, however, when more electrons than those introduced in a write mode are extracted from the floating gate, the threshold voltage of the EEPROM cell may be made negative, i.e., the EEPROM cell becomes a depletion type transistor. Such an erasing operation is called an over-erasing operation.

In order to compensate for such an over-erasing operation, there has been known an EEPROM cell having a split gate (see JP-A-2-23672). In this prior art EEPROM cell, an offset length between the floating gate and the source region is determined in self-alignment with the floating gate, to precisely adjust the channel length, the ratio of coupled capacitance of the control gate to the floating gate and the cell area. This will be explained later in detail.

In the above-described prior art EEPROM cell, however, since the ratio of coupled capacitance of the control gate to the floating gate is decreased, the controllability of the control gate to the floating gate is deteriorated. Also, if a channel region is not in alignment with the control gate, the controllability of the control gate is deteriorated. As a result, the efficiency of introducing hot electrons into the floating gate in a write mode, the efficiency of extracting electrons from the floating gate in a read mode, and a read current are reduced.

Further, the above-described prior art EEPROM cell is disadvantageous in terms of integration.

SUMMARY OF THE INVENTION

It is an object of the present invention to provide a nonvolatile semiconductor memory device having a large electron introduction efficiency, and a large electron extraction efficiency, and a large read current, and having a high integration.

According to the present invention, in a nonvolatile semiconductor memory device, including a semiconductor substrate, a floating gate formed over the semiconductor substrate, and a control gate formed over the floating gate, a split gate is formed on a sidewall of the control gate and the floating gate and is electrically connected to the control gate. A source region and a drain region are formed in the semiconductor substrate on the sides of the control gate and the split gate. Thus, the floating gate, the control gate, the split gate, the source region and the drain region can be formed in alignment with each other.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, a prior art nonvolatile semiconductor memory device will be explained with reference to FIGS. 1, 2A, 2B and 2C (see: the above-mentioned publication).

Figure 1:
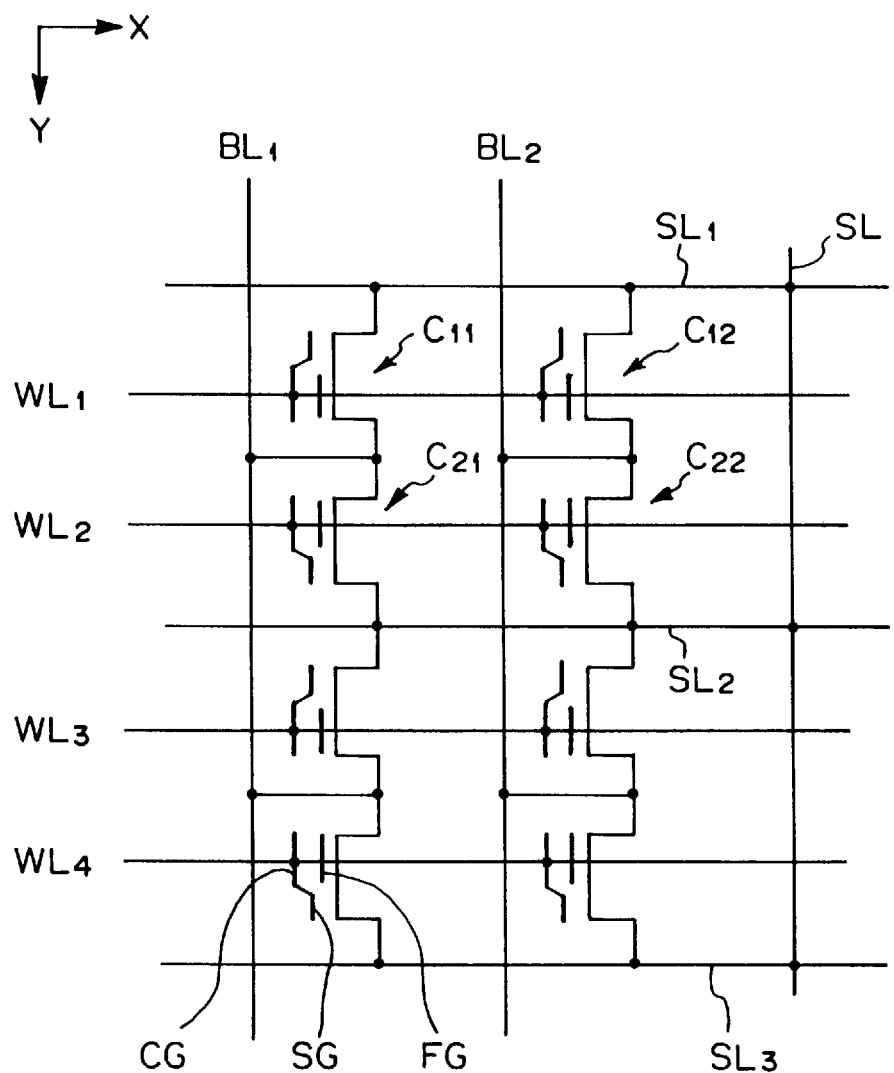
FIG. 1 is a circuit diagram illustrating a prior art nonvolatile semiconductor device.

In FIG. 1, which is a circuit diagram of the prior art NOR-type nonvolatile semiconductor memory device, word lines $WL_1$, $WL_2$, . . . and source lines $SL_1$, $SL_2$, . . . are arranged in parallel along an X direction, and bit lines $BL_1$, $BL_2$, . . . are arranged in parallel along a Y direction. The source lines $SL_1$, $SL_2$, . . . are connected to each other by a source line SL.

Memory cells $C_{11}$, $C_{12}$, . . . are connected at intersections among the word lines $WL_1$, $WL_2$, . . . the bit lines $BL_1$, $BL_2$, . . . and the source lines $SL_1$, $SL_2$, Each of the memory cells $C_{11}$, $C_{12}$, . . . includes a floating gate FG, a control gate CG connected to one of the word lines $W_1$, $WL_2$, . . . a source connected to one of the source lines $SL_1$, $SL_2$, . . . and a drain connected to one of the bit lines $BL_1$, $BL_2$, . . .

One memory cell of FIG. 1 is explained with reference to FIGS. 2A, 2B and 2C.

Figure 2A:
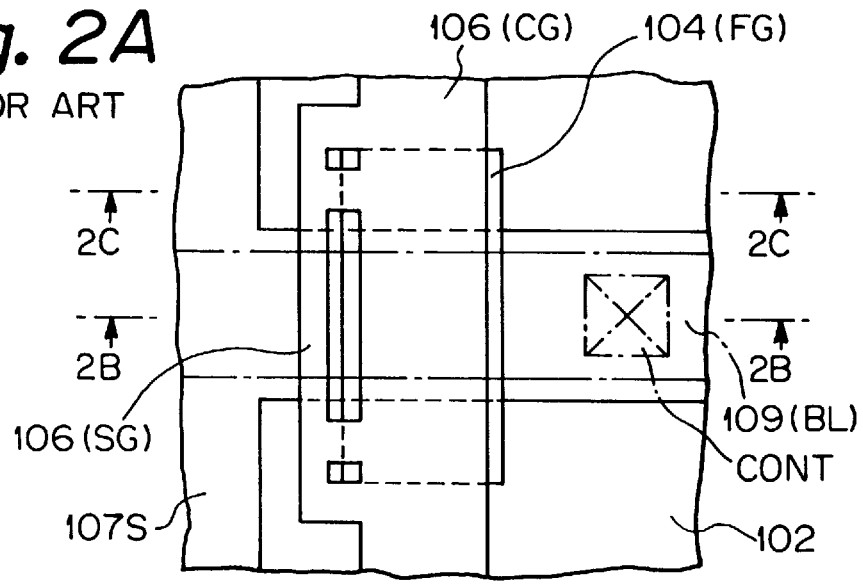
FIG. 2A is a plan view of the memory cell of FIG. 1.
Figure 2B:
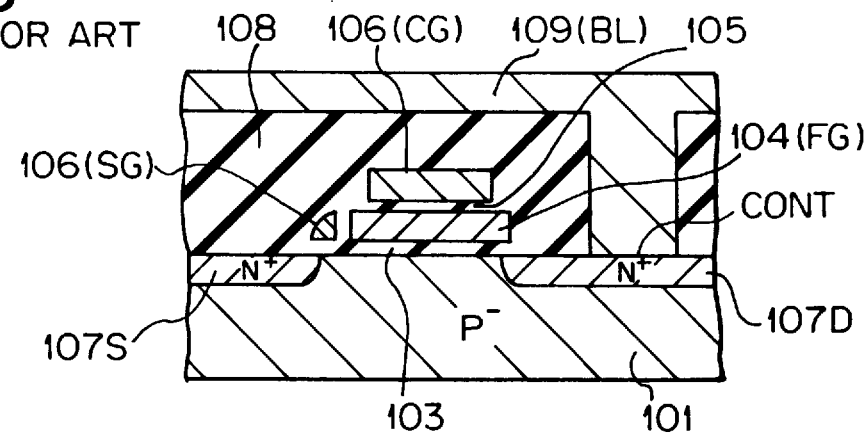
FIGS. 2B and 2C are cross-sectional views taken along the lines 2B—2B and 2C—2C, respectively, of FIG. 2A.
Figure 2C:
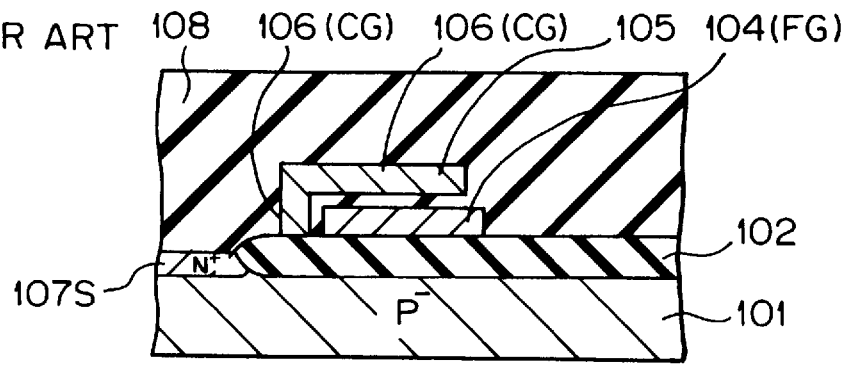

In FIGS. 2A, 2B and 2C, reference numeral 101 designates a P⁻-type monocrystalline silicon substrate on which a field silicon oxide layer 102 for isolating elements is formed. Also, a gate silicon oxide layer 103, a floating gate (FG) 104, a gate silicon oxide layer 105, and a control gate (CG) 106 are formed on the silicon substrate 101. The control gate 106 has an extension 106 (SG) which serves as a split gate. Also, reference numerals 107S and 107D designate an N⁺-type source region and an N⁺-type drain region, respectively. Further, provided on the entire surface is an insulating layer 108 on which a bit line 109 is formed. The bit line 109 is connected via a contact hole CONT to the drain region 107D.

The device of FIGS. 2A, 2B and 2C is manufactured as follows. First, the field silicon oxide layer 102 is formed on the silicon substrate 101, and thereafter, the gate silicon oxide layer 102 is formed thereon. Then, a polycrystalline silicon layer is deposited, and is patterned to form the floating gate 104 (FG). After that, the gate silicon oxide layer 105 is formed. Then, a polycrystalline silicon layer is deposited, and is patterned to form the control gate 106 (CG) and the split gate 106 (SG). Thereafter, an unnecessary split gate on the drain side is removed. Then, N-type impurities such as arsenic are doped into the silicon substrate 101 to form the source region 107S and the drain region 107D therein. Finally, the insulating layer 108 is formed, and an aluminum layer is deposited and is patterned to form the bit line 109 (BL).

In a write mode for the memory cell as illustrated in FIGS. 2A, 2B and 2C, a high positive voltage such as 12 V is applied to the control gate 106 (CG), and a high positive voltage such as 7 V is applied to the drain region 107D. On the other hand, the source region 107S and the silicon substrate 101 are grounded. As a result, hot electrons are generated in the vicinity of the drain region 107D, and accordingly, the hot electrons having an energy larger than an energy barrier of the gate silicon oxide layer 103 are introduced into the floating gate 104 (FG).

In a read mode for the memory cell as illustrated in FIGS. 2A, 2B and 2C, a positive voltage such as 3 V is applied to the control gate 106 (CG), and a positive voltage such as 2 V is applied to the drain region 107D. On the other hand, the source region 107S and the silicon substrate 101 are grounded.

In an erase mode for the memory cell as illustrated in FIGS. 2A, 2B and 2C, the control gate 106 (CG) and the silicon substrate 101 are grounded, and the source region 107S is put in a floating state. Also, a high positive voltage such as 14 V is applied to the drain region 107D. As a result, the electrons stored in the floating gate 104 (FG) are extracted therefrom to the drain region 107D utilizing the Fowler-Nordheim tunneling effect.

In the memory cell of FIGS. 2A, 2B and 2C, however, since the floating gate 104 (FG) and the control gate 106 (CG) are formed separately by using individnal photolithography processes, the control gate 106 (CG) may be deviated from the floating gate 104 (FG). In order to reduce this deviation, the control gate 106 (CG) needs to be so small that the ratio of coupled capacitance of the control gate 106 (CG) to the floating gate 104 (FG) is reduced. This deteriorates the control characteristics of the control gate 106 (CG) to the floating gate 104 (FG). Also, since a channel region is not in alignment with the control gate 106 (CG), the control characteristics of the control gate 106 (CG) to the channel region are deteriorated. As a result, the efficiency of introducing hot electrons into the floating gate 104 (FG) and the efficiency of extracting electrons, and a read current are reduced. Further, in order to compensate for the deviation of the control gate 106 (CG) to the floating gate 104 (FG), the area of memory cells has to be increased, to thereby reduce the integration.

Figure 3:
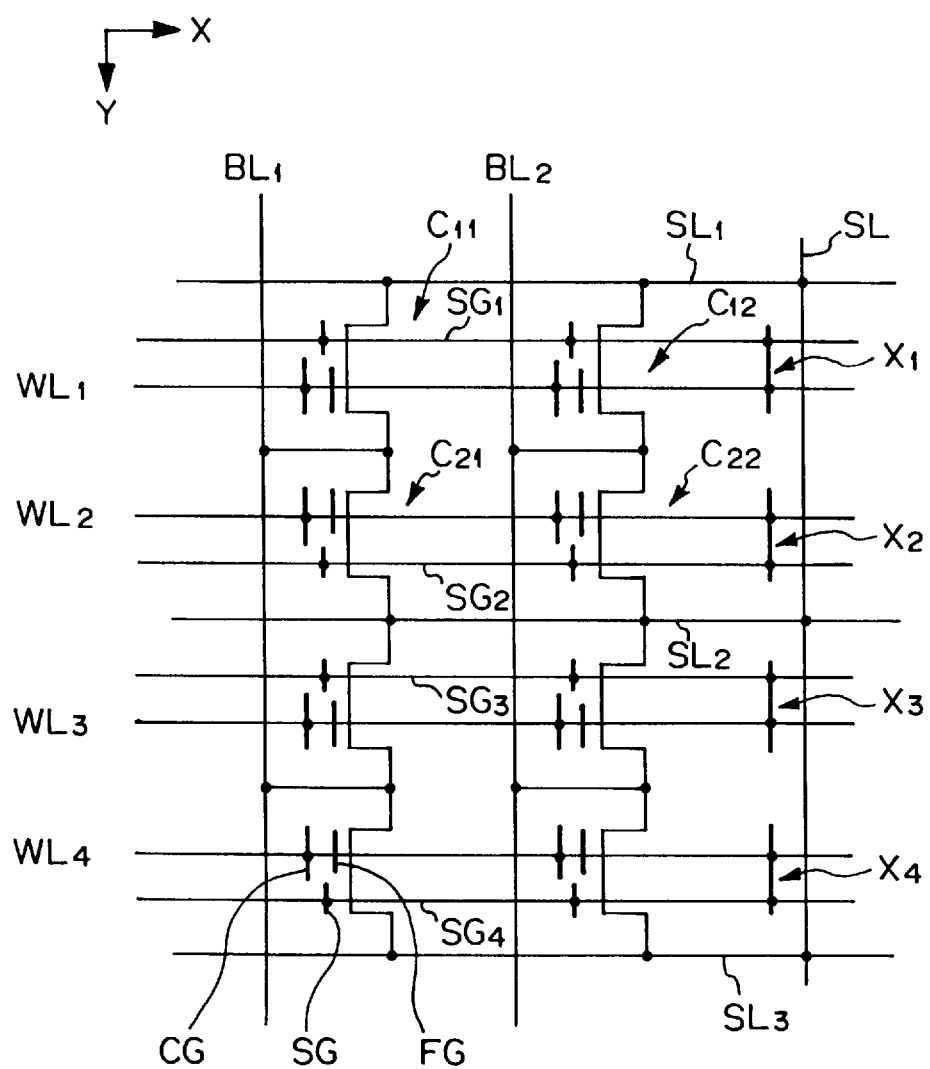
FIG. 3 is a circuit diagram illustrating a first embodiment of the nonvolatile semiconductor memory device according to the present invention.

In FIG. 3, which illustrates a first embodiment of the present invention, split gate lines $SG_1$, $SG_2$, . . . are provided in parallel with the word lines $WL_1$, $WL_2$, . . . , respectively. The split gate lines $SG_1$, $SG_2$, . . . are connected to the word lines $WL_1$, $WL_2$, . . . i.e., the control gates not within the memory cells $C_{11}$, $C_{12}$, . . . , but in the field areas as indicated by $X_1$, $X_2$, . . . Also, the split gate lines $SG_1$, $SG_2$, . . . are formed as sidewalls of the word lines $WL_1$, $WL_2$, . . . , i.e., the control gates and the floating gates.

The operation of the device of FIG.3 is the same as that of FIG. 1.

The manufacturing steps of the device of FIG. 3 are explained next with reference to FIGS. 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B and 12C.

Figure 4A:
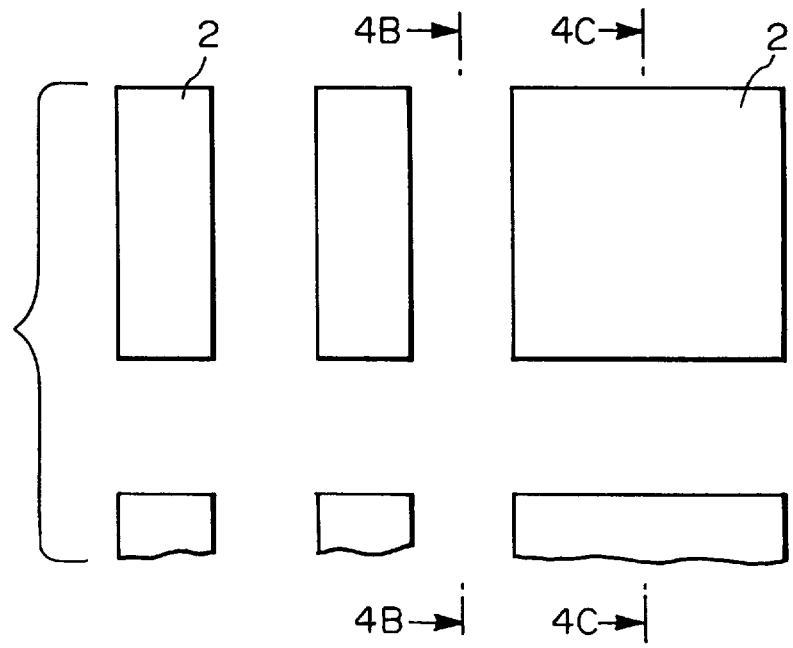
FIGS. 4A, 5A, 6A, 7A, 8A, 9A, 10A, 11A and 12A are plan views for explaining the manufacturing steps of the device of FIG. 3.
Figure 4B:
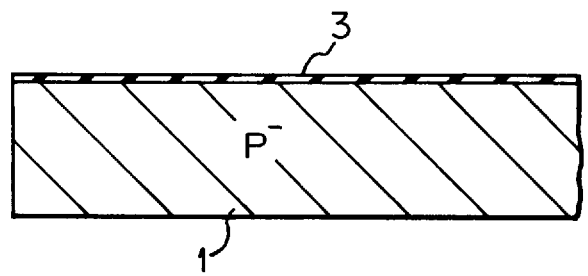
FIGS. 4B and 4C are cross-sectional views taken along the lines 4B—4B and 4C—4C, respectively, of FIG. 4A.
Figure 4C:
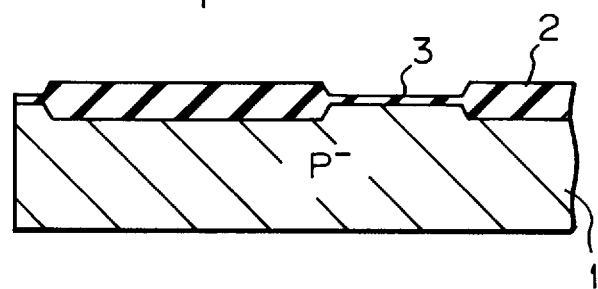

First, referring to FIGS. 4A, 4B and 4C, a relatively thick field silicon oxide layer 2 is formed on a P⁻-type monocrystalline silicon substrate 1 having a concentration of about $2 \times 10^{15}$ borons/cm³ by a local oxidation of silicon (LOCOS). Also, an about 7 to 10 nm thick gate silicon oxide layer 3 is formed by thermally oxidizing the silicon substrate 1.

Figure 5A:
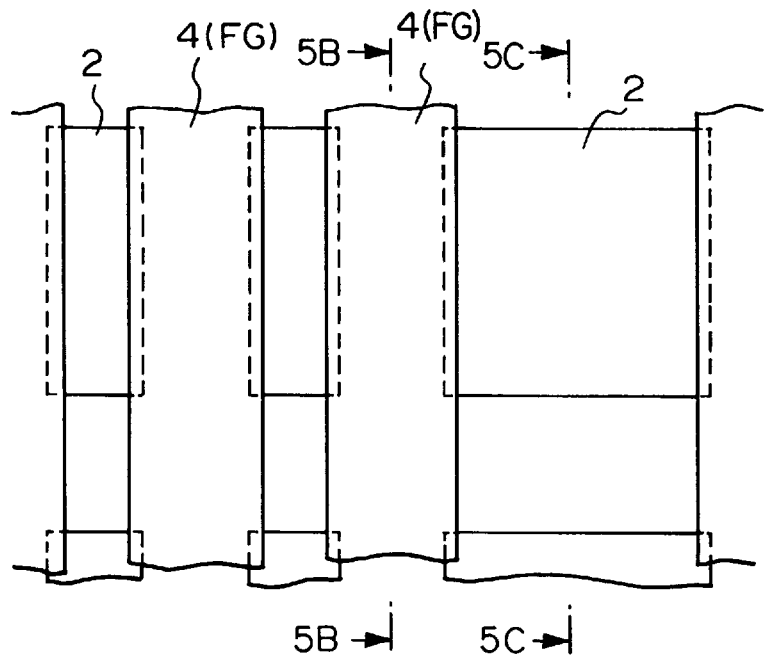
Figure 5B:
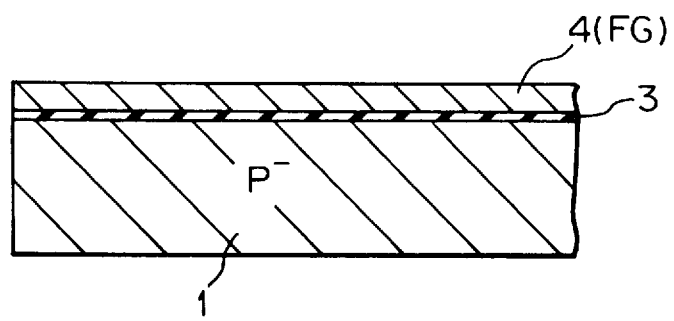
FIGS. 5B and 5C are cross-sectional views taken along the lines 5B—5B and 5C—5C, respectively, of FIG. 5A.
Figure 5C:
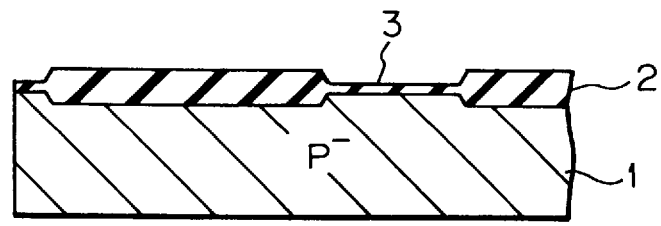

Next, referring to FIGS. 5A, 5B and 5C, a polycrystalline silicon layer 4 is deposited by a chemical vapor deposition (CVD) process, and phosphorous ions are doped thereinto to reduce the resistance thereof. Then, the polycrystalline silicon layer 4 is patterned by using a photolithography and etching process.

Figure 6A:
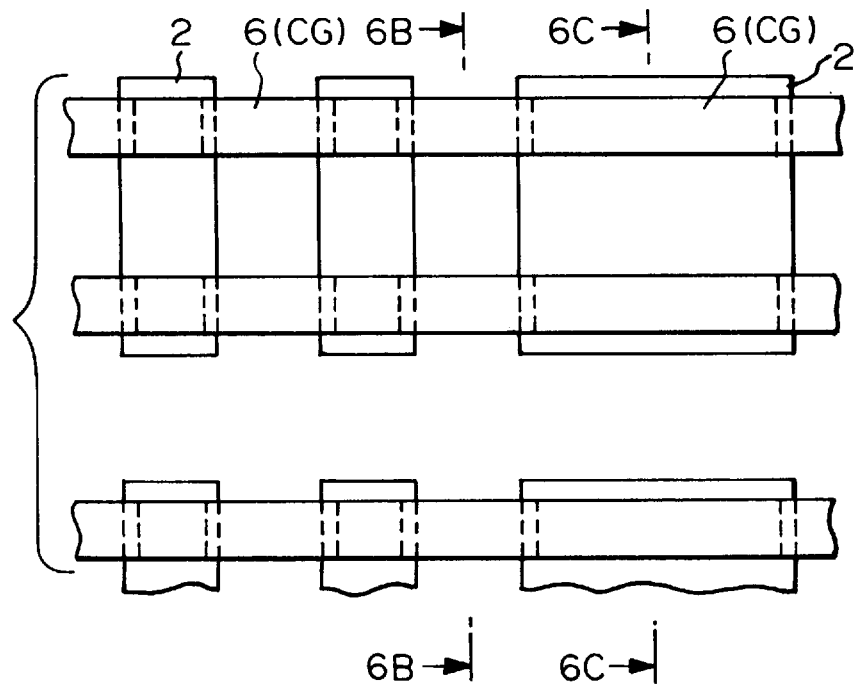
Figure 6B:
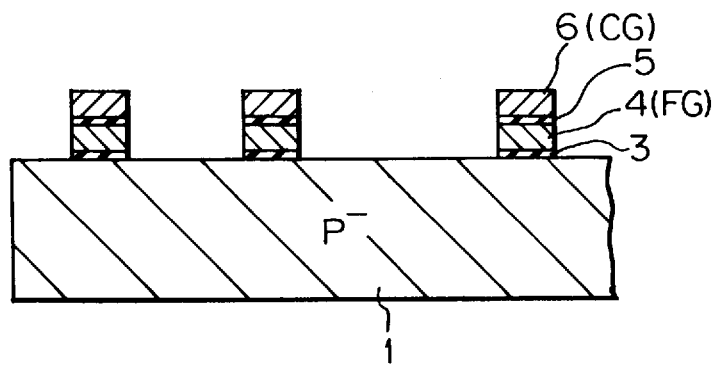
FIGS. 6B and 6C are cross-sectional views taken along the lines 6B—6B and 6C—6C, respectively, of FIG. 6A.
Figure 6C:
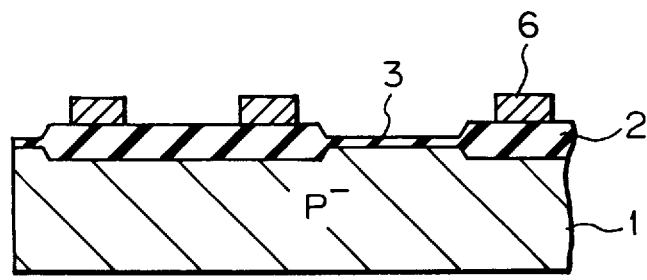

Next, referring to FIGS. 6A, 6B and 6C, a gate insulating layer 5 made of a laminated configuration of silicon oxide, silicon nitride and silicon oxide (ONO) is deposited by using a low temperature CVD process. In this case, the gate insulating layer 5 is about 20 nm thick in terms of silicon oxide. The ONO configuration has good leakage current characteristics. Also, a polycide layer 6 made of polycrystalline silicon and metal silicide is deposited by a CVD process and a sputtering process. Note that polycrystalline silicon can be used for the polycide layer 6.

Then, the polycide layer 6, the gate insulating layer 5, the polycrystalline silicon layer 4 and the gate silicon oxide layer 3 are patterned by a photolithography and etching process. Thus, the control gate 6 (CG) and the floating gate 4 (FG) are formed in self-alignment with each other.

Figure 7A:
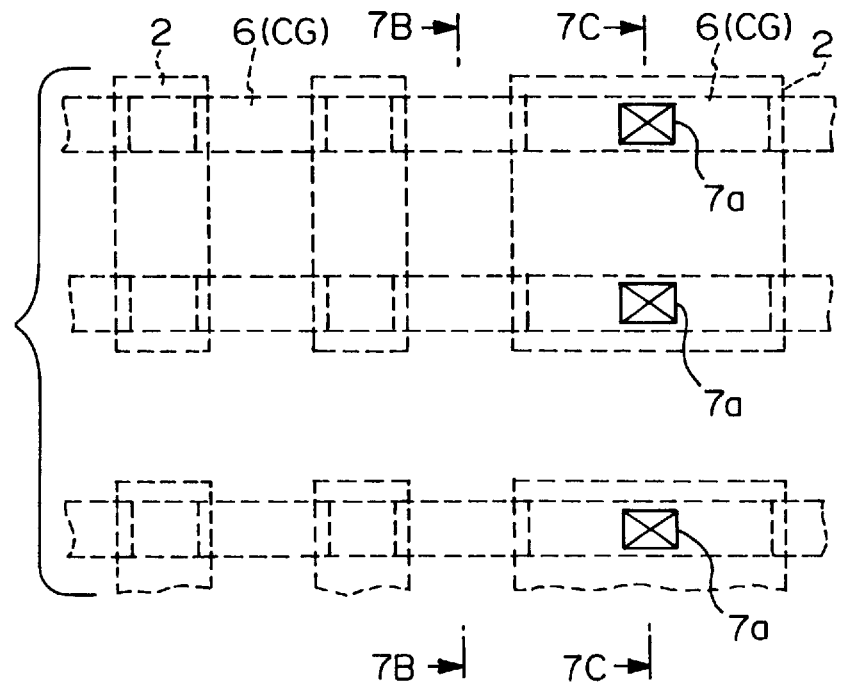
Figure 7B:
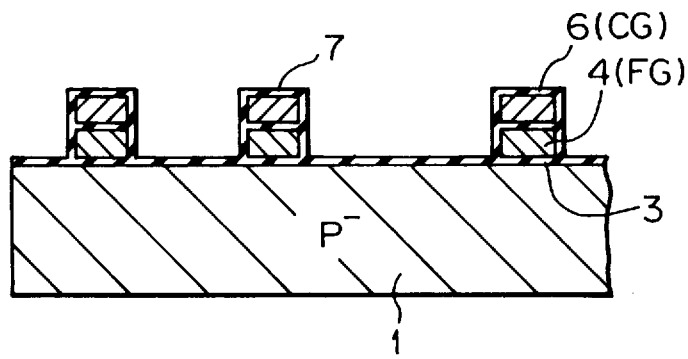
FIGS. 7B and 7C are cross-sectional views taken along the lines 7B—7B and 7C—7C, respectively, of FIG. 7A.
Figure 7C:
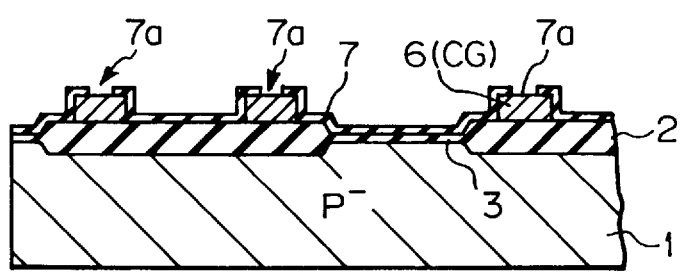

Next, referring to FIGS. 7A, 7B and 7C, an about 0.1 to 0.5 µm thick silicon oxide layer 7 is deposited by using a CVD process. Then, openings 7a are perforated in the silicon oxide layer 7 in the field area as illustrated in FIGS. 7A and 7C. Note that the openings 7a can be formed just on the control gate 6 (CG), or can extend to the field silicon oxide layer 2.

Figure 8A:
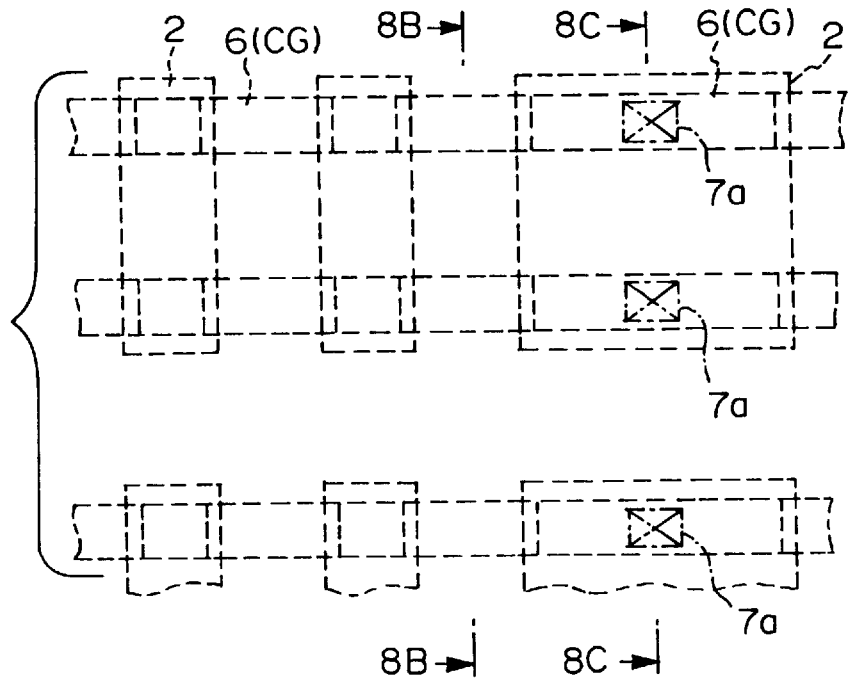
Figure 8B:
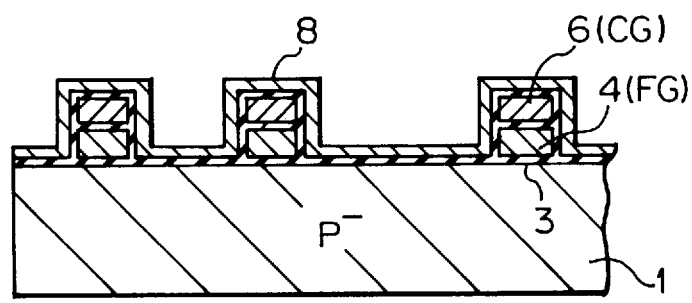
FIGS. 8B and 8C are cross-sectional views taken along the lines 8B—8B and 8C—8C, respectively, of FIG. 8A.
Figure 8C:
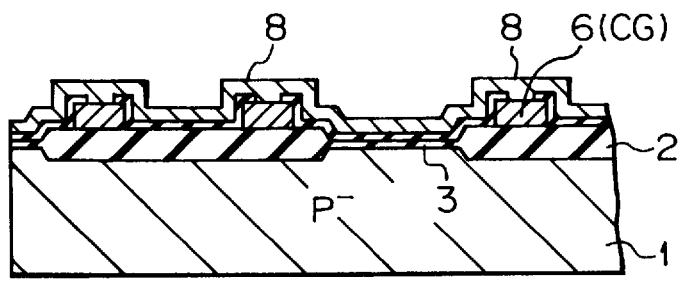

Next, referring to FIGS. 8A, 8B and 8C, an about 0.25 µm thick polycrystalline silicon layer 8 is deposited by a CVD process.

Figure 9A:
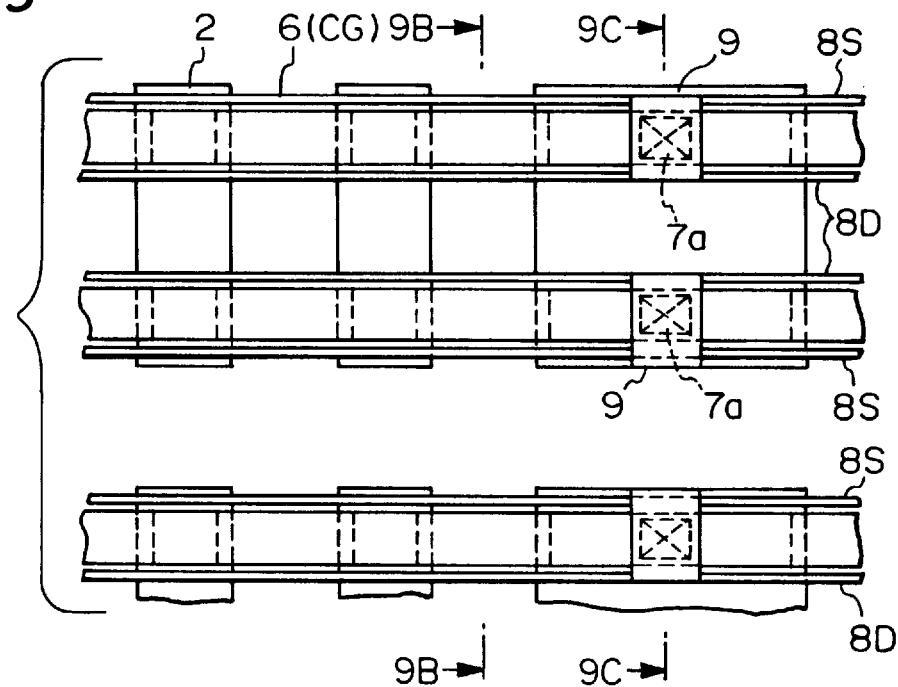
Figure 9B:
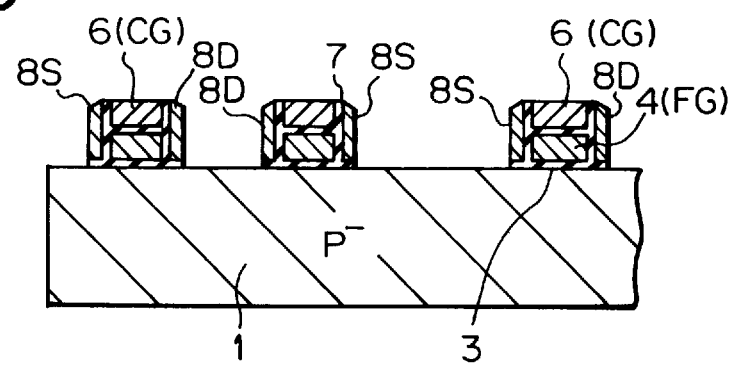
FIGS. 9B and 9C are cross-sectional views taken along the lines 9B—9B and 9C—9C, respectively, of FIG. 9A.
Figure 9C:
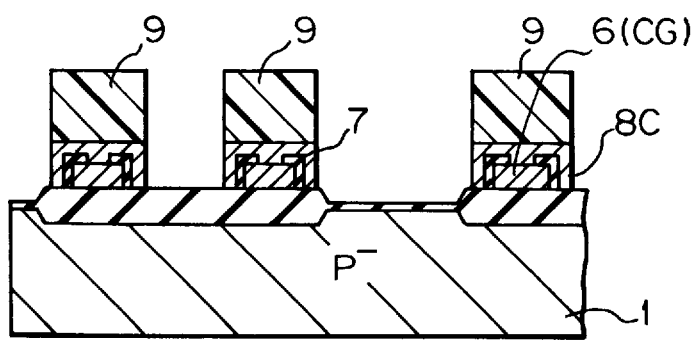

Next, referring to FIGS. 9A, 9B and 9C, a photoresist pattern 9 is formed to cover the openings 7a of the polycrystalline silicon layer 8. Then, the polycrystalline silicon layer 8 is etched by using an anisotropic etching process, so that split gates 8S and 8D are formed on the sidewall of the control gate 6 (CG) and the floating gate 4 (FG). In this case, the polycrystalline silicon layer 8 is left as a layer 8C at the openings 7a, and therefore, the split gates 8S and 8D are electrically connected via the openings 7a to the control gate 6 (CG). Then, the photoresist pattern 9 is removed.

Figure 10A:
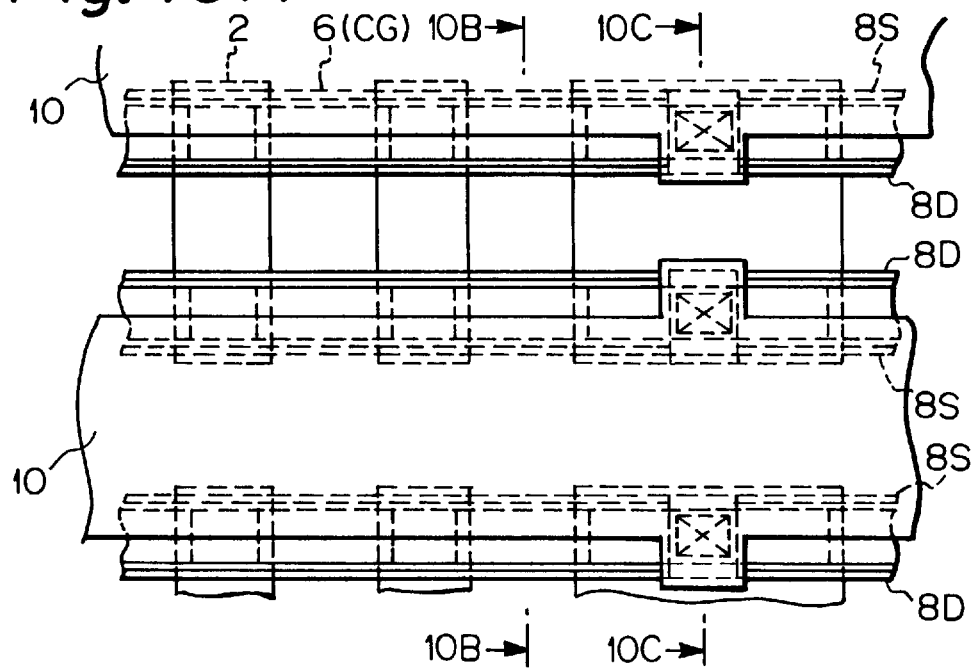
Figure 10B:
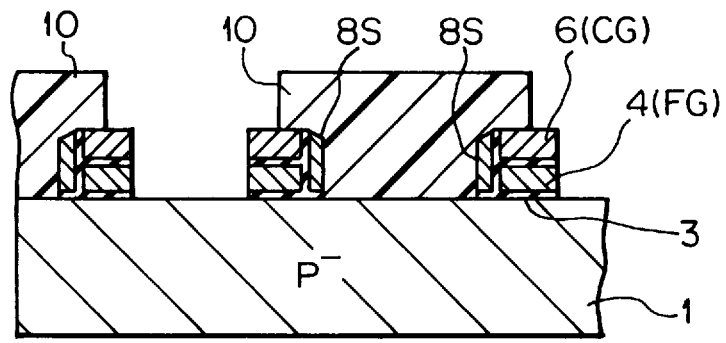
FIGS. 10B and 10C are cross-sectional views taken along the lines 10B—10B and 10C—10C, respectively, of FIG. 10A.
Figure 10C:
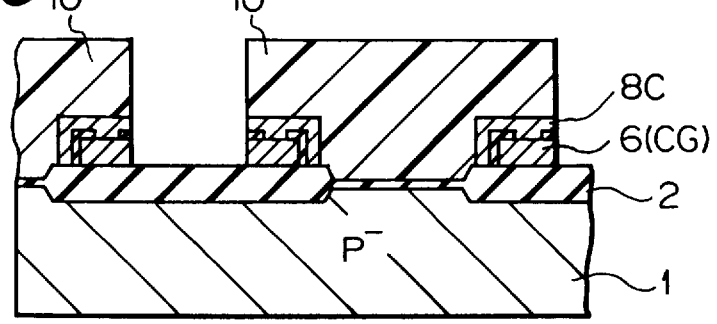

Next, referring to FIGS. 10A, 10B and 10C, a photoresist pattern 10 is formed to cover the split gate 8S and the layer 8C. Then, the split gate 8D is removed by an anisotropic etching process or a wet etching process. Then, the photoresist pattern 10 is removed.

Figure 11A:
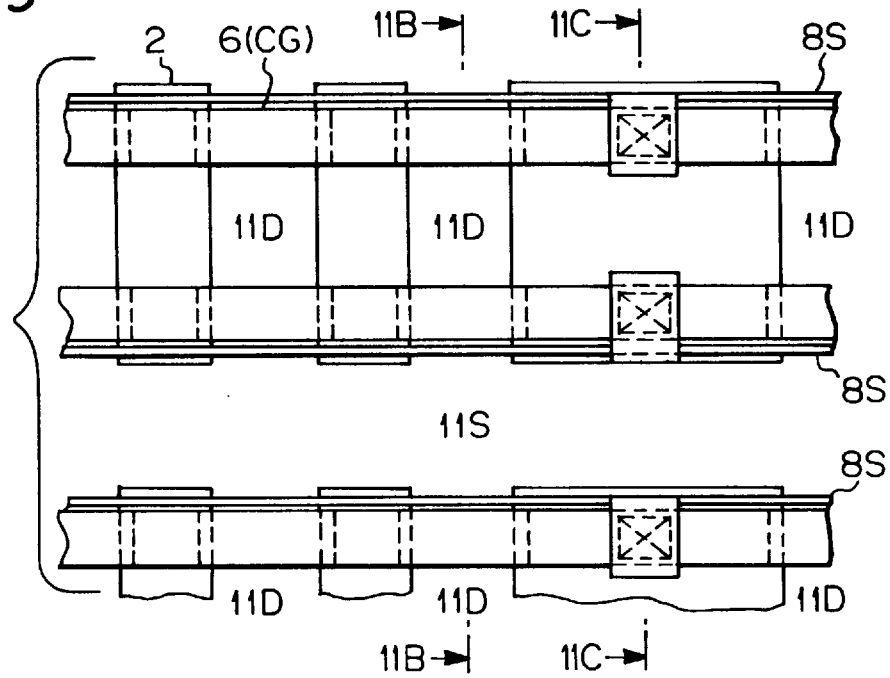
Figure 11B:
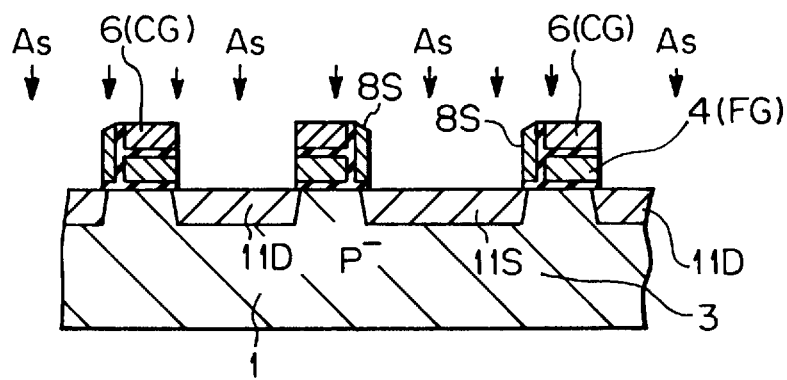
FIGS. 11B and 11C are cross-sectional views taken along the lines 11B—11B and 11C—11C, respectively, of FIG. 11A.
Figure 11C:
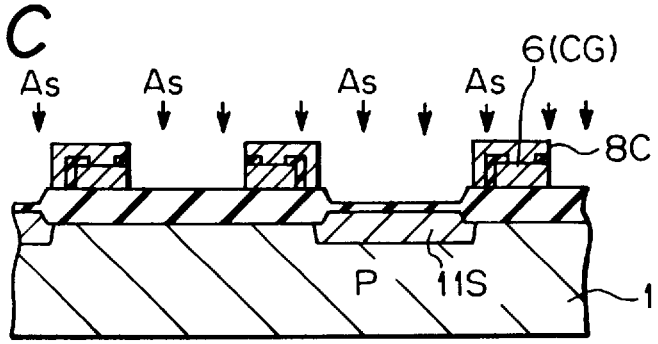

Next, referring to FIGS. 11A, 11B and 11C, about 1 to $5 \times 10^{15}$ arsenic ions/cm$^3$ are implanted into the silicon substrate 1 with a mask of the control gate 6 (CG), the split gate 8S and the layer 8C. Then, an annealing operation at 800° to 950° C. is carried out. Thus, a source region 11S and drain regions 11D are formed within the silicon substrate 1.

Figure 12A:
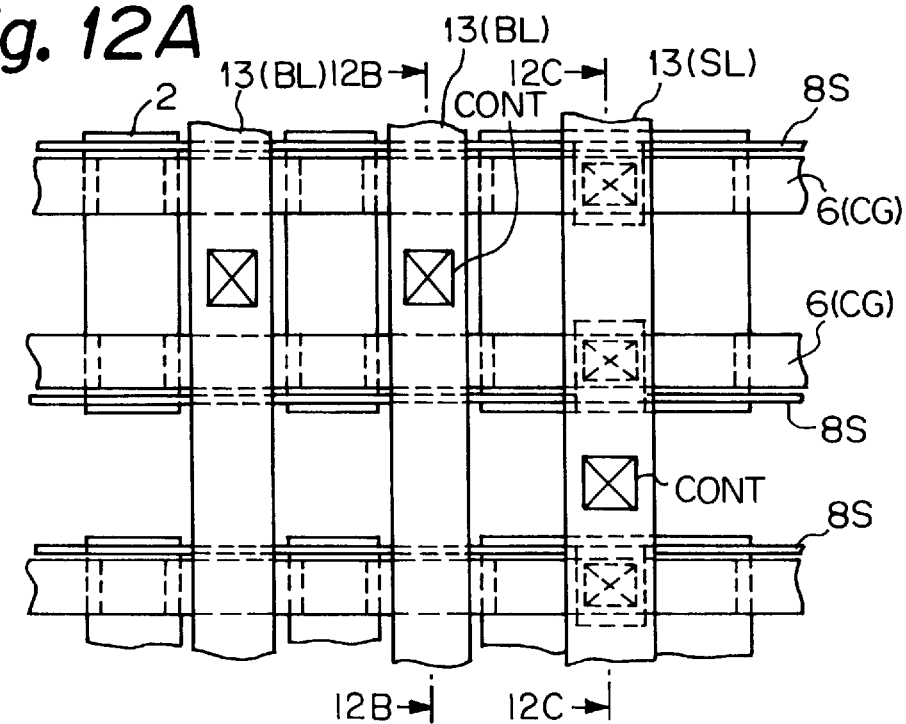
Figure 12B:
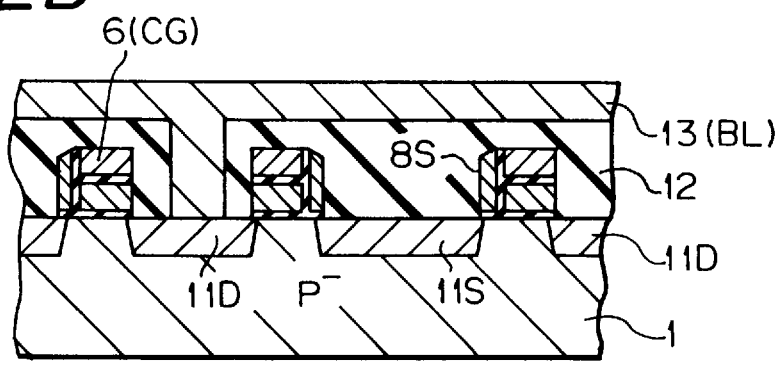
FIGS. 12B and 12C are cross-sectional views taken along the lines 12B—12B and 12C—12C, respectively, of FIG. 12A.
Figure 12C:
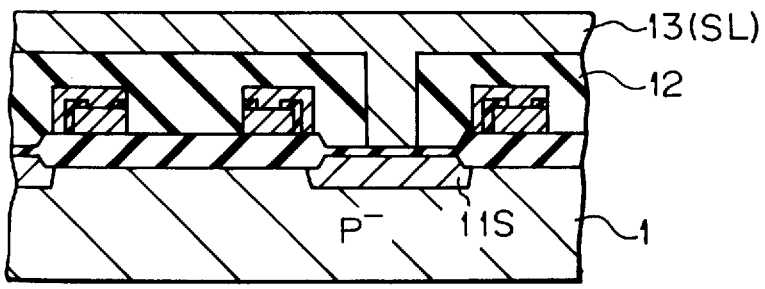

Finally, referring to FIGS. 12A, 12B and 12C, an insulating layer 12 is deposited by using a CVD process. Thereafter, an aluminum layer 13 is deposited by a sputtering process, and is patterned to form a bit line 13 (BL) and a source line 13 (SL).

Thus, the device of FIG. 3 is completed.

In the first embodiment, the floating gate 4 (FG), the control gate 6 (CG), the split gate 8S, the source region 11S and the drain regions 11D are in alignment with each other. Also, the split gate 8S is electrically connected to the control gate 6 (CG) in the field area.

Figure 13:
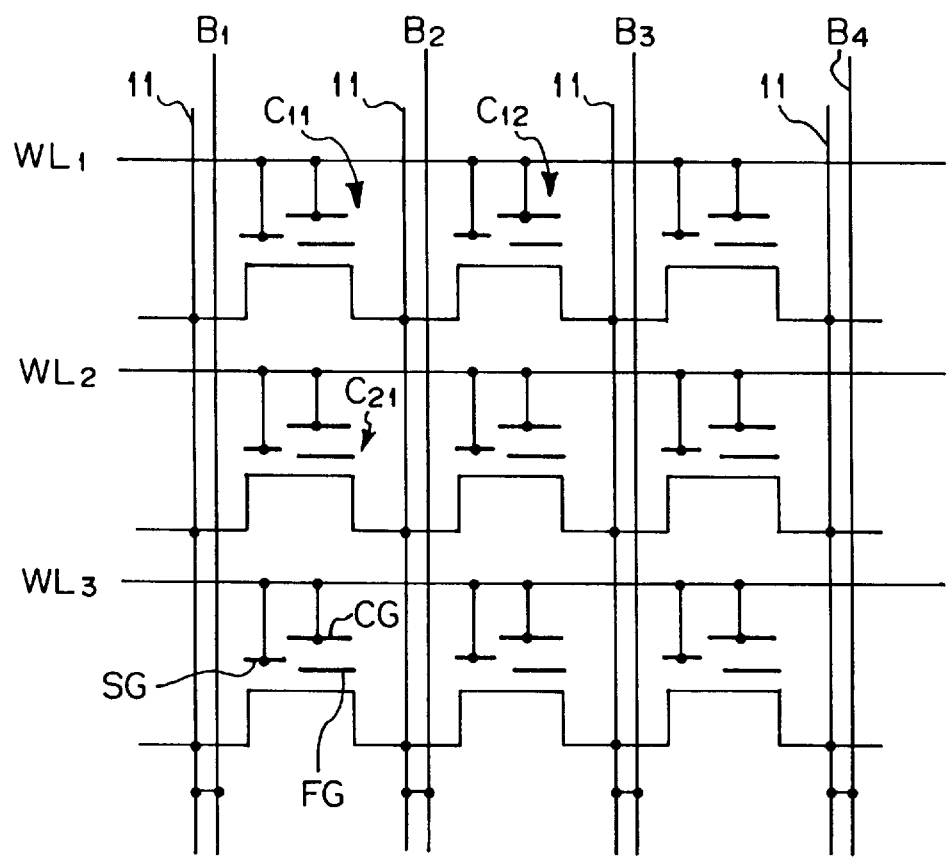
FIG. 13 is a circuit diagram illustrating a second embodiment of the nonvolatile semiconductor memory device according to the present invention.

In FIG. 13, which illustrates a second embodiment of the present invention, a virtual ground type nonvolatile semiconductor memory device is illustrated. In FIG. 13, the N$^+$-type impurity regions 11 serve as the bit lines as well as the source/drain regions, and the N$^+$-type impurity regions are supported by backing aluminium lines $B_1$, $B_2$, ..., which are called main bit lines. For example, in a read mode for the memory cell $C_{21}$, the voltage at the word line $WL_2$ is made 5 V, and the other word lines are grounded. Also, the main bit line $B_1$ is grounded and the voltage at the main bit line $B_2$ is made 1.5 V while the other main bit lines are in a floating state. As a result, a read current flowing from the main bit line $B_2$ via the memory cell $C_{21}$ to the main bit line $B_1$ is detected. Also, the split gates SG are connected via the word lines $WL_1$, $WL_2$, ..., to the control gates within the memory cells $C_{11}$, $C_{12}$, ... Further, in this case, the split gates SG are formed as sidewalls of the word lines $WL_1$, $WL_2$, ..., i.e., the control gates and the floating gates.

The manufacturing steps of the device of FIG. 13 are explained next with reference to FIGS. 14A, 14B, 15A, 15B, 16A, 16B, 17A, 17B, 18A, 18B, 19A, 19B, 20A and 20B.

Figure 14A:
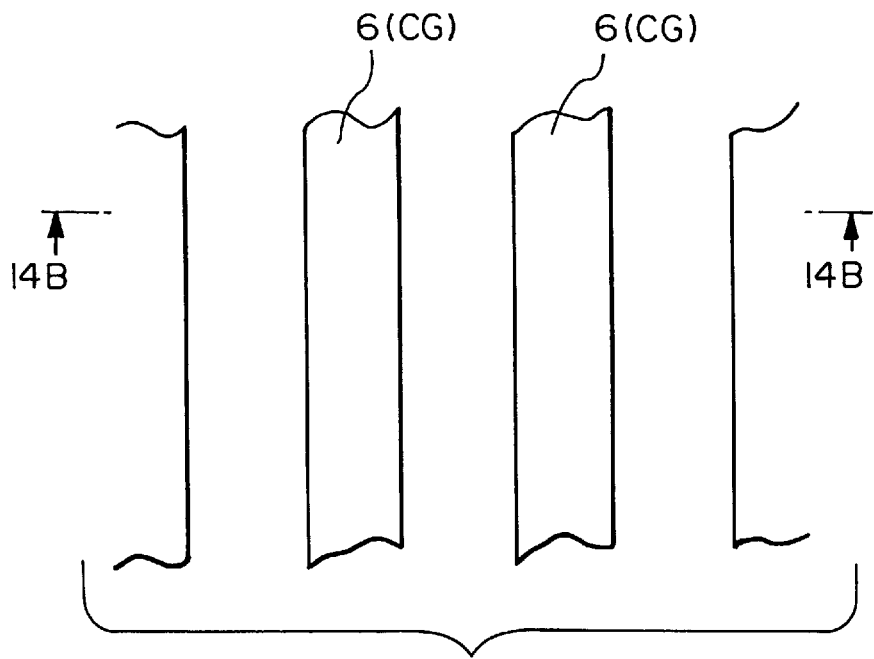
FIGS. 14A, 15A, 16A, 17A, 18A, 19A, and 20A are plan views for explaining the manufacturing steps of the device of FIG. 3.
Figure 14B:
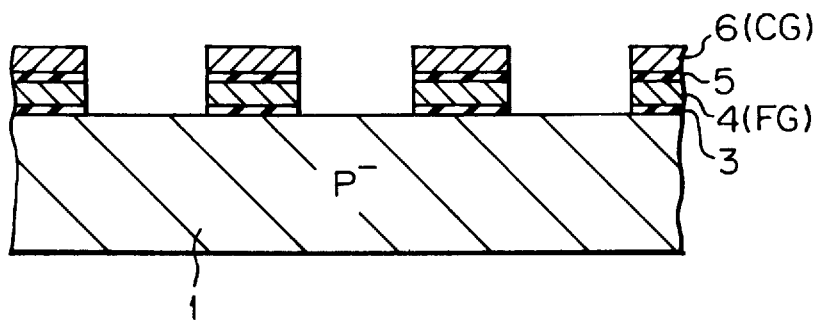
FIGS. 14B, 15B, 16B, 17B, 18B, 19B and 20B are cross-sectional views taken along the lines 14B—14B, 15B—15B, 16B—16B, 17B—17B, 18B—18B, 19B—19B, and 20B—20B of FIGS. 14A, 15A, 16A, 17A, 18A, 19A and 20A, respectively.

First, referring to FIGS. 14A and 14B, an about 7 to 10 nm thick gate silicon oxide layer 3 is formed by thermally oxidizing a P$^-$-type monocrystalline silicon substrate 1 having a concentration of about $2 \times 10^{15}$ borons/cm$^3$. Then, a polycrystalline silicon layer 4 is deposited by a CVD process, and phosphorous ions are doped thereinto to reduce the resistance thereof. Then, a gate insulating layer 5 made of a laminated configuration of silicon oxide, silicon nitride and silicon oxide (ONO) deposited by using a low temperature CVD process. In this case, the gate insulating layer 5 is about 20 nm thick in terms of silicon oxide. Also, a polycide layer 6 made of polycrystalline silicon and metal silicide is deposited by a CVD process and a sputtering process. Also, note that polycrystalline silicon can be used for the polycide layer 6.

Then, the polycide layer 6, the gate insulating layer 5, the polycrystalline silicon layer 4 and the gate silicon oxide layer 3 are patterned by a photolithography and etching process. Thus, the control gate 6 (CG) and the floating gate 4 (FG) are formed in self-alignment with each other.

Figure 15A:
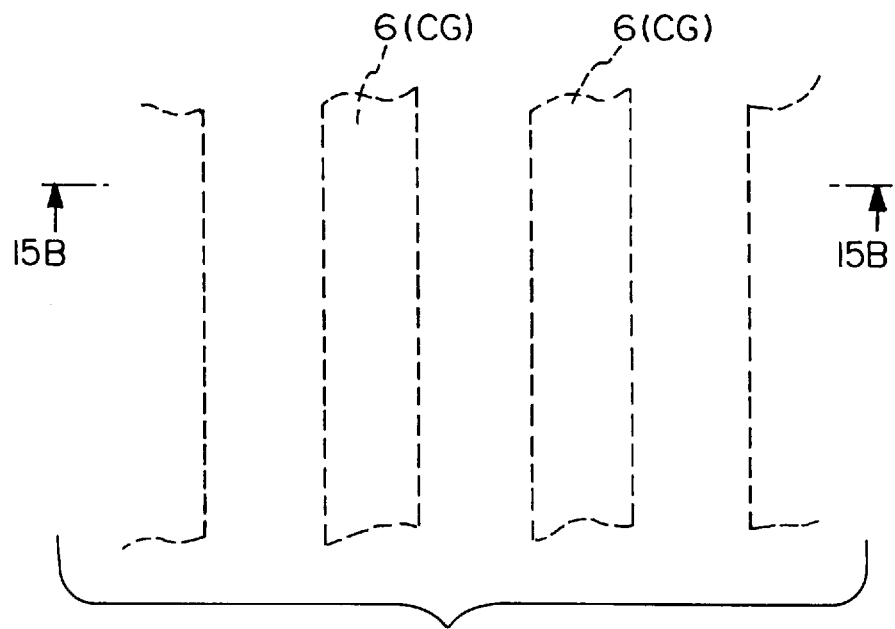
Figure 15B:
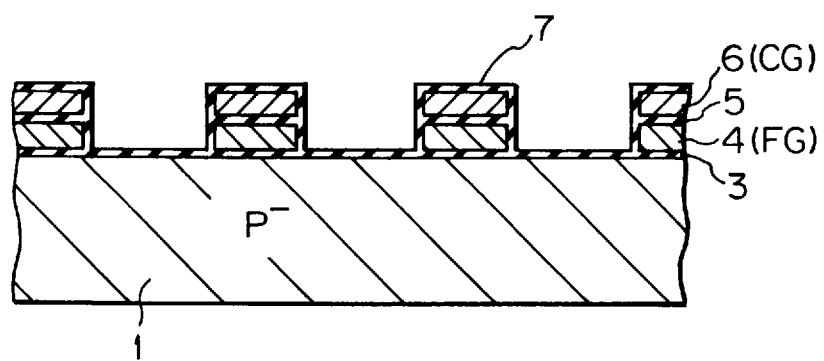

Next, referring to FIGS. 15A and 15B, an about 0.1 to 0.5 µm thick silicon oxide layer 7 is deposited by using a CVD process.

Figure 16A:
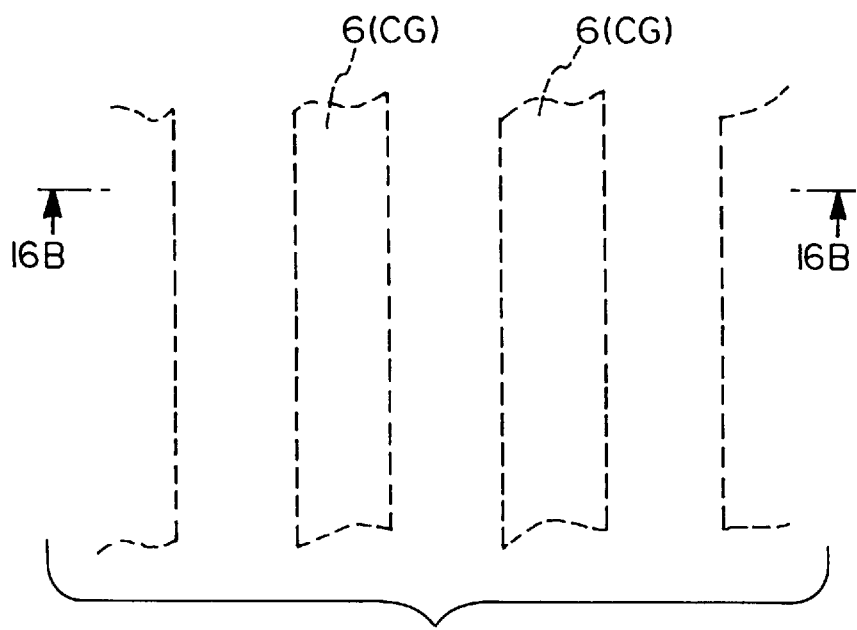
Figure 16B:
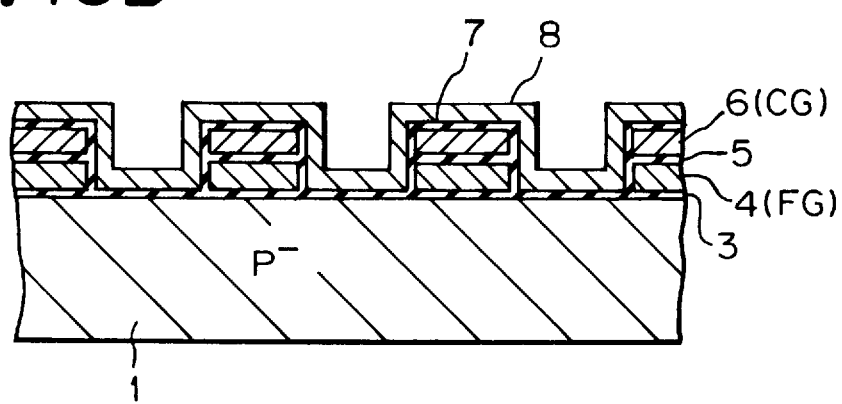

Next, referring to FIGS. 16A and 16B, an about 0.25 µm thick polycrystalline silicon layer 8 is deposited by a CVD process.

Figure 17A:
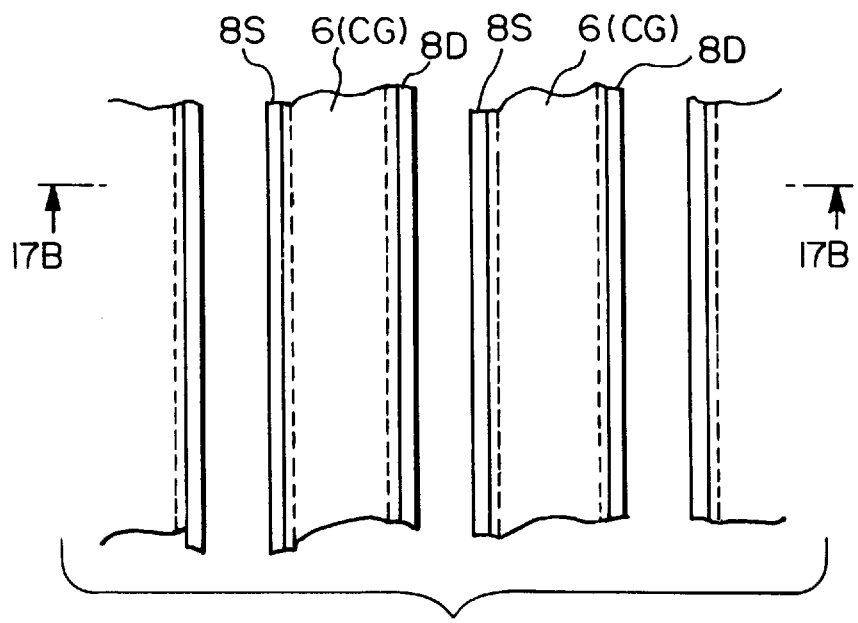
Figure 17B:
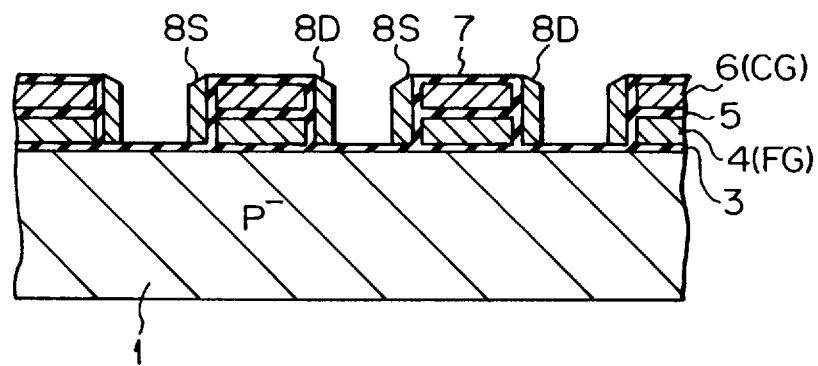

Next, referring to FIGS. 17A and 17B, the polycrystalline silicon layer 7 is etched by using an anisotropic etching process, so that split gates 8S and 8D are formed on the sidewall of the control gate 6 (CG) and the floating gate 4 (FG).

Figure 18A:
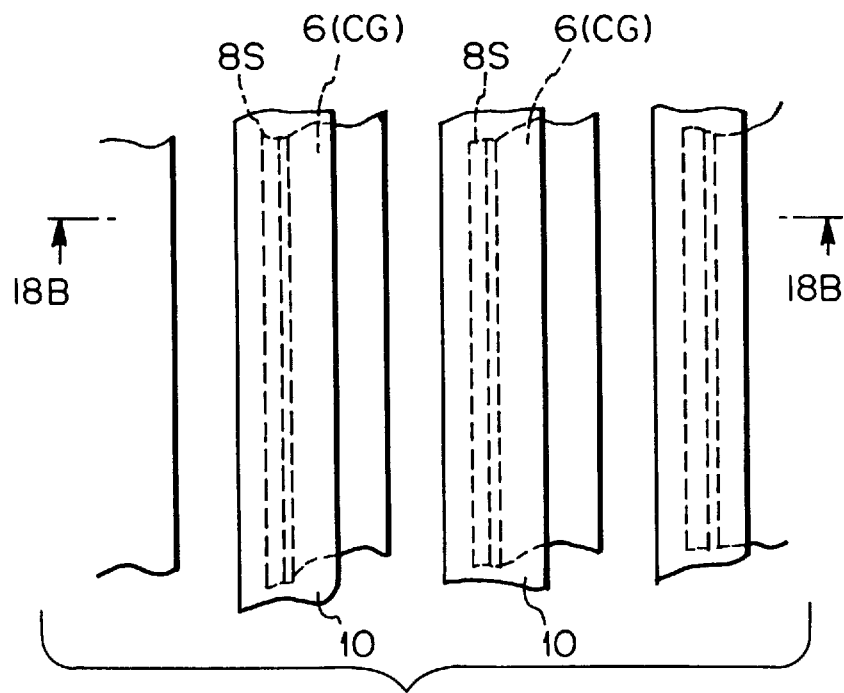
Figure 18B:
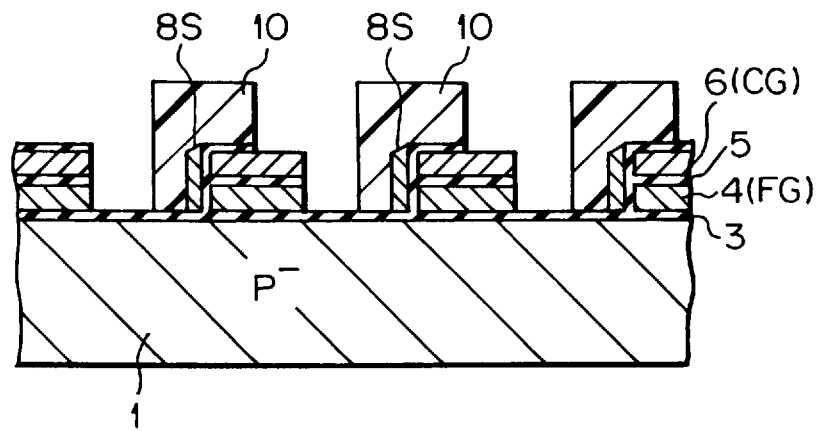

Next, referring to FIGS. 18A and 18B, a photoresist pattern 10 is formed to cover the split gate 8S. Then, the split gate 8D is removed by an anisotropic etching process or a wet etching process. Then, the photoresist pattern 10 is removed.

Figure 19A:
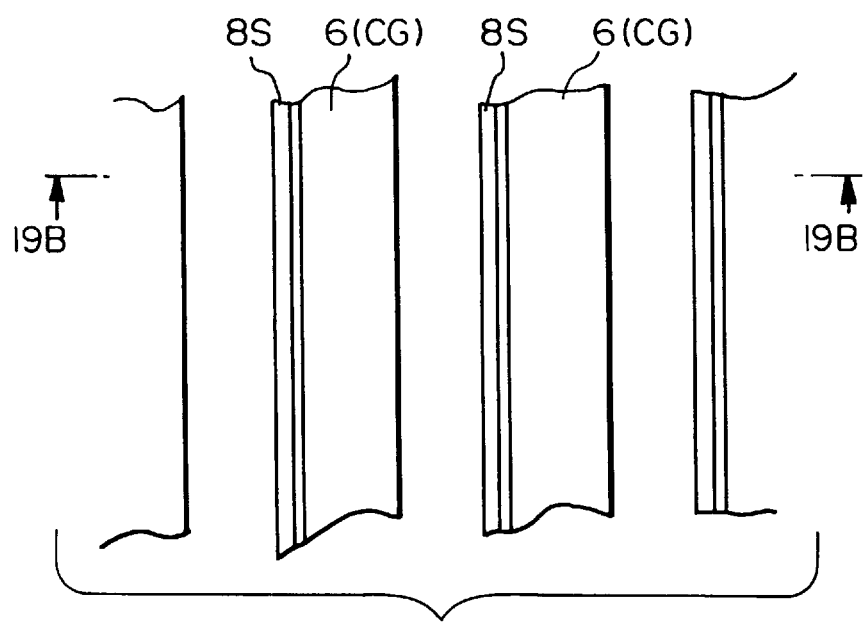
Figure 19B:
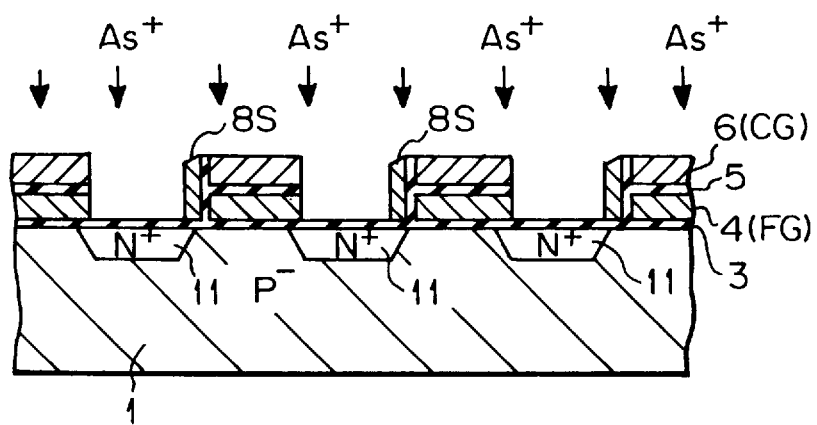

Next, referring to FIGS. 19A and 19B, about 1 to $5 \times 10^{15}$ arsenic ions/cm$^2$ are implanted into the silicon substrate 1 with a mask of the control gate 6 (CG), the split gate 8S. Then, an annealing operation at 800° to 950° C. is carried out. Thus, source/drain regions 11 are formed within the silicon substrate 1.

Figure 20A:
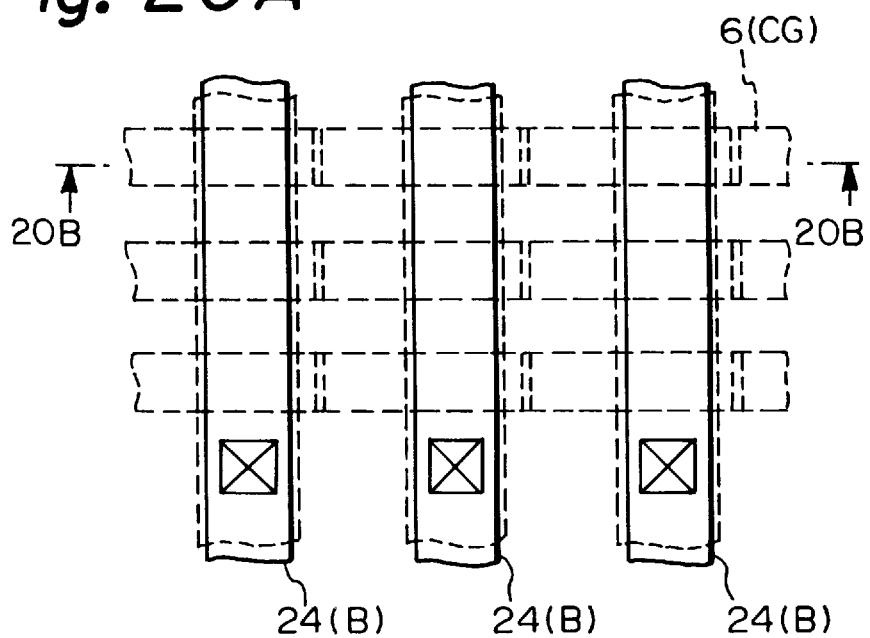
Figure 20B:
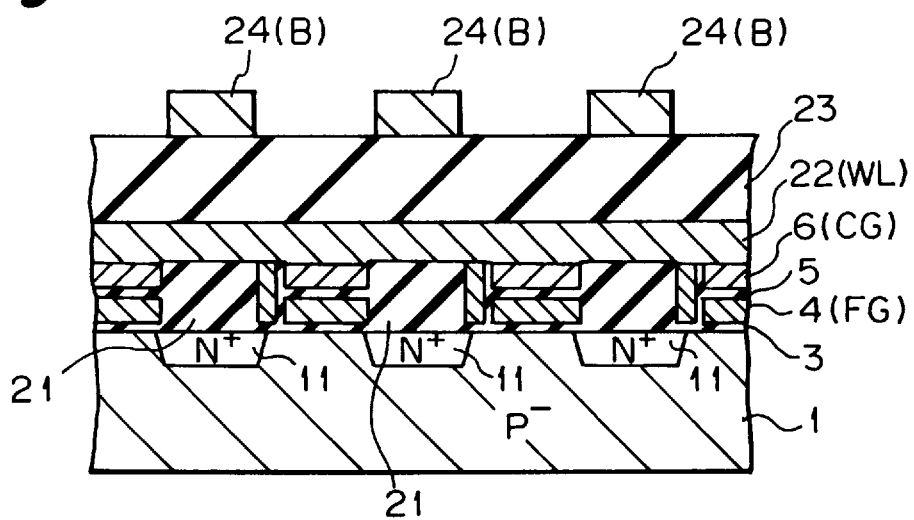

Finally, referring to FIGS. 20A and 20B, an insulating layer 21 made of boron-included phosphorous silicon glass (BPSG) is deposited by using a CVD process, and the insulating layer 21 is etched back so that the insulating layer 21 is buried between the stacked configuration by the control gate 6 (CG), the gate insulating layer 5, the floating gate 4 (FG) and the split gate 8S. Then, a polycide layer 22 is deposited by a CVD process and a sputtering process, and the polycide layer 22 is patterned to form the word line 22 (WL). In this case, the control gate 6 (CG), the gate insulating layer 5, the floating gate 4 (FG) and the silicon oxide layer 3 are etched to conform to each of the memory cells. An insulating layer 23 is deposited by using a CVD process. Thereafter, an aluminum layer 24 is deposited by a sputtering process, and is patterned to form a main bit line 24 (B), which is electrically connected via contacts to the source/drain region 11.

Thus, the device of FIG. 13 is completed.

In the second embodiment, the floating gate 4 (FG), the control gate 6 (CG), the split gate 8S and the source/drain regions 11 are in alignment with each other. Also, the split gate 8S is electrically connected via the word line to the control gate 6 (CG).

As explained hereinbefore, according to the present invention, since the floating gate and the control gate are formed in self-alignment with each other, the control gate can be so large with respect to the floating gate that the ratio of coupled capacitance of the control gate to the floating gate is increased. As a result, the control characteristics of the control gate to the floating gate can be improved. Also, as a channel region is in alignment with the control gate, the control characteristics of the control gate to the channel region can be improved. As a result, the efficiency of introducing hot electrons into the floating gate and the efficiency of extracting electrons, and a read current are enhanced. Further, since it is unnecessary to compensate for the deviation of the control gate to the floating gate, the area of memory cells can be decreased, to thereby enhance the integration.

I claim:

1. A method for manufacturing a nonvolatile semiconductor memory device, comprising the steps of:

forming a first insulating layer (3) formed on a semiconductor substrate (1) of a first conductivity type;

forming a first conductive layer (4) on said first insulating layer;

forming a second insulating layer (5) on said first conductive layer;

forming a second conductive layer (6) on a second insulating layer;

patterning said second conductive layer, said second insulating layer, said first conductive layer and said first insulating layer, to form a first control gate pattern made of said second conductive layer and a first floating gate pattern made of said first conductive layer in parallel with a first direction;

forming a third insulating layer (7) on said first control gate pattern and said first floating gate pattern;

forming a third conductive layer (8) on said third conductive layer;

etching back said third conductive layer to form first split gate patterns on both sidewalls of said first control gate pattern and said first floating gate pattern;

removing one of said first split gate patterns on one of said sidewalls of said first control gate pattern and said first floating gate pattern;

introducing impurities of a second conductivity type opposite to said first conductivity type into said semiconductor substrate with a mask of said first control gate pattern and said split gate pattern to form source and drain regions (1) in said semiconductor substrate;

forming a fourth conductive layer (22) on said first control pattern and said first split gate pattern;

patterning said fourth conductive layer, said first control gate pattern and said first floating gate pattern to form a word line made of said fourth conductive layer, a second control gate pattern made of said first control gate pattern, a second floating gate pattern made of said first floating gate pattern, and a second split gate pattern made of said first split gate pattern in parallel with a second direction opposite to said first direction, said second split gate pattern being electrically connected via said word line to said second control gate pattern.

2. A method as set forth in claim 1, further comprising a step of fitting an insulating layer (21) on said source and drain regions before the formation of said fourth conductive layer.

3. A method as set forth in claim 1, wherein said step of forming a first insulating layer (3) forms a silicon oxide layer by thermally oxidizing a p- type monocrystalline silicon substrate (1) having a concentration of about $2\times10^{15}$ borons/$cm^3$, said first insulating layer (3) having a thickness between about 7 and 10 nanometers.

4. A method as set forth in claim 1, wherein said step of forming a first conductive layer (4) includes the steps of depositing a polycrystalline silicon layer by a CVD process and doping phosphorous ions thereinto.

5. A method as set forth in claim 1, wherein said step of forming a second insulating layer (5) includes the step of forming a laminated configuration of silicon oxide, silicon nitride and silicon oxide (ONO) deposited using a low temperature CVD process.

6. A method as set forth in claim 5, wherein in the step of forming a second insulating layer (5), the silicon oxide layer of the second insulating layer (5) has a thickness of about 20 nanometers.

7. A method as set forth in claim 1, wherein said step of forming a second conductive layer (6) forms a layer of polycrystalline silicon and metal silicide deposited by a CVD process and a sputtering process.

8. A method as set forth in claim 1, wherein said step of forming a second conductive layer (6) forms a layer of polycrystalline silicon deposited by a CVD process and a sputtering process.

9. A method as set forth in claim 1, wherein said step of patterning said second conductive layer, said second insulating layer, said first conductive layer and said first insulating layer is performed using a photolithography and etching process to form the first control gate pattern and the first floating gate pattern in self alignment.

10. A method as set forth in claim 1, wherein said step of forming a third insulating layer (7) forms a silicon oxide layer with a thickness between about 0.1 and 0.5 micrometers deposited using a CVD process.

11. A method as set forth in claim 1, wherein said step of forming a third conductive layer (8) forms a polycrystalline silicon layer with a thickness of about 0.25 micrometers deposited using a CVD process.

12. A method as set forth in claim 1, wherein said step of removing one of said first split gate patterns includes the steps of:

forming a photoresist pattern (10) to cover a portion of the split gate pattern;

removing another portion of the split gate pattern by an anisotropic etching process or a wet etching process; and removing the photoresist pattern.

* * * * *

UNITED STATES PATENT AND TRADEMARK OFFICE
CERTIFICATE OF CORRECTION

PATENT : 5,891,775
DATED : April 6, 1999
INVENTOR(S) : Yosiaki HISAMUNE

It is certified that error appears in the above-identified patent and that said Letters Patent is hereby corrected as shown below:

Column 3, line 22, delete "$W_1$" and insert --$WL_1$--.

Signed and Sealed this

Twenty-third Day of November, 1999

Attest:

Q. TODD DICKINSON

*Attesting Officer*   *Acting Commissioner of Patents and Trademarks*